United States Patent [19]

Beun

[11] Patent Number: 4,764,414
[45] Date of Patent: Aug. 16, 1988

[54] DEVICE FOR THE MOUNTING OF HYBRID CIRCUIT SUBSTRATES ON PRINTED CIRCUIT BOARD

[75] Inventor: Roger A. Beun, Dunrobin, Canada

[73] Assignee: Northern Telecom Limited, Montreal, Canada

[21] Appl. No.: 915,843

[22] Filed: Oct. 3, 1986

[51] Int. Cl.⁴ ............................................. B32B 3/00
[52] U.S. Cl. .................................... 428/195; 428/209;
428/901; 174/68.5; 361/399; 361/415
[58] Field of Search ............... 174/68.5; 361/399, 415;
211/41; 428/195, 209, 901

[56] References Cited

U.S. PATENT DOCUMENTS

| | | | |
|---|---|---|---|
| 449,654 | 4/1891 | Albin et al. | 211/41 |
| 2,620,928 | 12/1952 | Brooks | 211/41 |
| 3,829,741 | 8/1974 | Athey | 317/101 DH |
| 4,473,263 | 9/1984 | Sunstein | 339/17 LM |

FOREIGN PATENT DOCUMENTS 0151550  10/1981  Fed. Rep. of Germany ...... 361/399

Primary Examiner—John E. Kittle
Assistant Examiner—P. J. Ryan
Attorney, Agent, or Firm—F. P. Turpin

[57] ABSTRACT

The device comprises a mounting frame adapted to receive and support the hybrid circuit and a pair of wing frames, one at each end of the thin frame for supporting it at a predetermined angle in relation to the printed circuit board. The wing frames may be angled outwardly away from the mounting frame thereby allowing a plurality of the devices to be nestled adjacent one another in close proximity.

9 Claims, 3 Drawing Sheets

DEVICE FOR THE MOUNTING OF HYBRID CIRCUIT SUBSTRATES ON PRINTED CIRCUIT BOARD

FIELD OF THE INVENTION

The invention relates to a device for the mounting of components on printed circuit boards and more particularly to the mounting of a daughterboard on a motherboard.

BACKGROUND OF THE INVENTION

In the design of printed circuit boards for use in electronic equipment, it is often desirable to increase the component carrying capacity of a particular board for circuit function considerations. For example, a memory cluster is available commercially from one particular semiconductor manufacturer. The component consists of a plurality of memory integrated circuit packages clustered on a relatively small printed circuit board which is pluggable in a connector mounted on a motherboard.

In telecommunication systems such as telephone switching systems, it is also desirable to use appendage circuits or daughterboards mounted on printed circuit boards of the system. For example, some types of line circuits are realized using a thick film hybrid circuit which is configured separately on its own substrate. The substrate is provided with a plurality of pins suitable for insertion into cooperating mounting holes in the motherboard. Hence, the hybrid circuit substrate is treated as a conventional component.

A problem associated with the mounting of hybrid substrates on printed circuit boards is that they consume considerable shelf space since the lateral inter-spacing of printed circuit boards along a shelf of equipment must allow for the height of the daughterboards mounted on the boards. The problem may be solved by mounting the daughterboard flat on the motherboard with the mounting pins bent at a right angle thereinto. However, this solution tends to be impracticable in that it results in the consumption of the very printed circuit board real estate savings realized through the use of a daughterboard. The mounting of a hybrid circuit or the like at an angle other than horizontal or orthogonal to the motherboard is usually not workable because the weight of the circuit may cause its connecting pins to work free or to be stressed to the point of breaking or separating from the circuit.

Another solution to the problem of mounting a daughterboard on a motherboard have been to use stand-offs and a wiring harness between the boards. Yet another method is to use a connector into which the daughterboard may be plugged. Both of these solutions are impractical in that they are expensive or awkward to implement in the manufacturing process.

The invention solves the above-discussed problem of mounting a thick film hybrid circuit on a motherboard in a very economical manner that allows the motherboards's lateral shelf space to be minimized.

SUMMARY OF THE INVENTION

In accordance with the invention there is provided a hybrid circuit support device comprising a frame of plastic material into which the hybrid circuit may be mounted. A pair of triangular frame sections, one at each end of the mounting frame, support the frame at a predetermined angle in relation to the mounting surface of the printed circuit board thereby minimizing the lateral spacing between pairs of boards and allowing the space under the frame to be used conventionally.

In a described embodiment of the invention, the frame into which the hybrid circuit is mounted is a C-shaped resilient frame and the triangular frame sections are angled outwardly to allow the nesting or stacking of a plurality of hybrid circuits in close proximity to each other.

In an alternate embodiment of the invention, the mounting frame is a rectangular structure into which the hybrid circuit may be press-fitted and secured therein by means of at least a pair of bumps or protrusions along the inside periphery of the frame.

DESCRIPTION OF THE DRAWINGS

Example embodiments of the invention will now be described in conjunction with the drawings in which.

DETAILED DESCRIPTION

Figure 1:
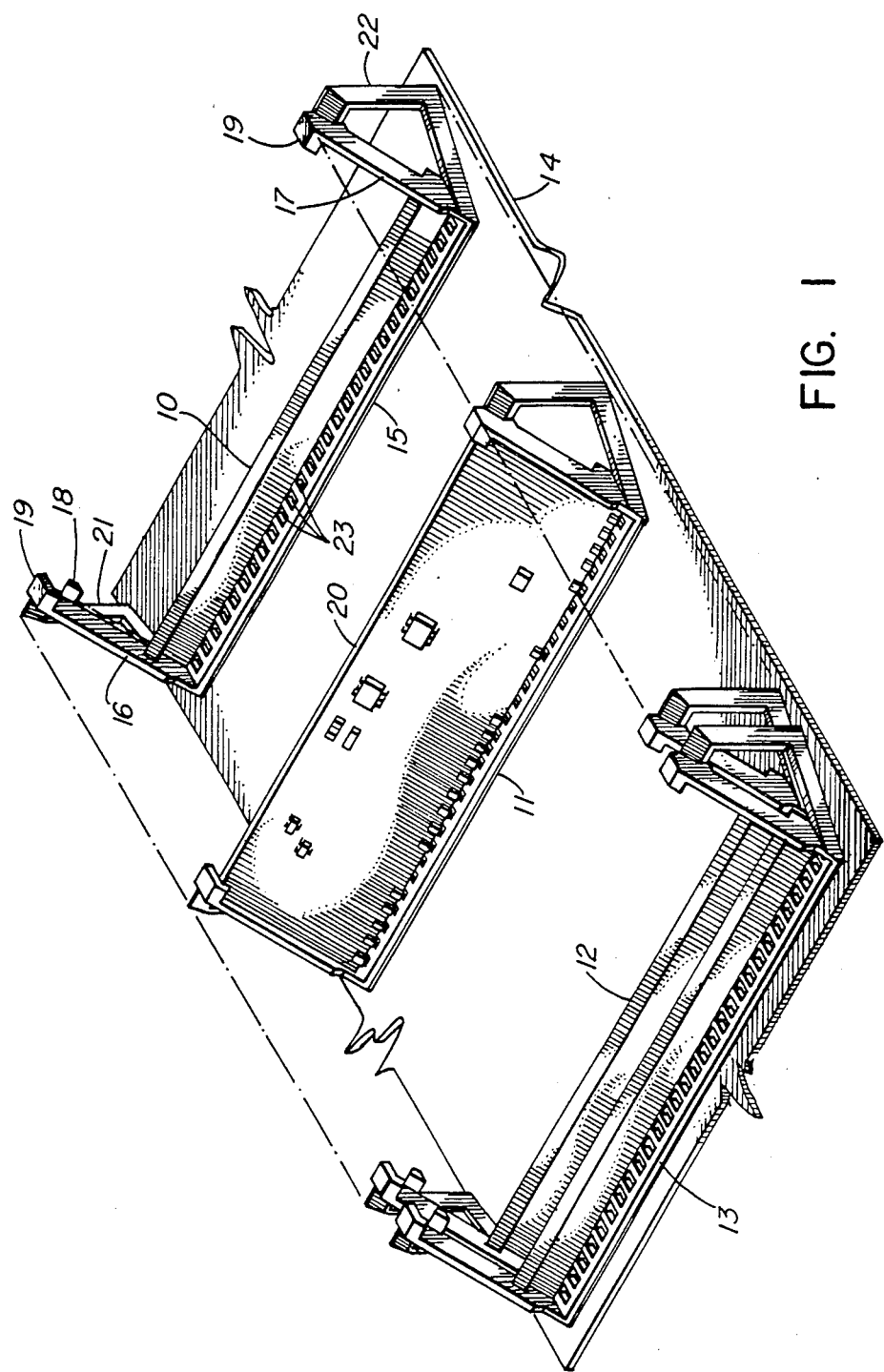
FIG. 1 is a perspective view of a plurality of support devices in accordance with the invention.

FIG. 1 is a perspective view of four support devices 10, 11, 12, 13 mounted on a printed circuit board 14. The invention will be described in conjunction with all the drawings as they represent various views of the same structure and the elements in the drawings have therefore been similarly labelled.

The support device 10 is shown to include a C-shaped frame comprised of a base portion 15 and arms 16 and 17. Each end of arms 16 and 17 have a pair of cooperating tabs 18 and 19 adapted to receive a daughterboard or hybrid substrate 20 therebetween as shown mounted in support device 11. Supporting the C-shaped frame and thus the hybrid substrate at a predetermined angle are a pair of wing frames 21 and 22. These are a pair of triangularly shaped frames attached to respective ends of the base portion 15. Ideally, the entire support structure 10, 11, 12 or 13, is a moulding of plastic material which is non-conductive and which exhibits some resiliency. The base portion 15 may be provided with a plurality of holes 23 along its length for accommodating the connecting pins of the hybrid substrate circuit 20. During the manufacturing of the printed circuit board 14, the hybrid circuit is inserted into a frame 11 by placing the connecting pins of the circuit 20 through the holes 23 in the base portion 15, outwardly flexing the arms 16 and 17 of the wing frames 21 and 22 to allow the upper corners of the circuit 20 to be positioned between the pairs of tabs 18 and 19. The support device 11 together with the hybrid circuit 20 may then be affixed to the printed circuit board 14 as any other component.

The angle at which the hybrid circuit is supported on the board 14 is of course dependent on the shape of the wing frames 21 and 22. This angle may vary from ninety degrees down to practically zero; however an angle of about forty-five degrees has been found to be practical in that it allows access to the components mounted in the shadow of the hybrid circuit 20 and still minimizes the lateral space occupied by the board 14 to the point where the limitation often becomes the front mounting plate thereof.

Figure 2:
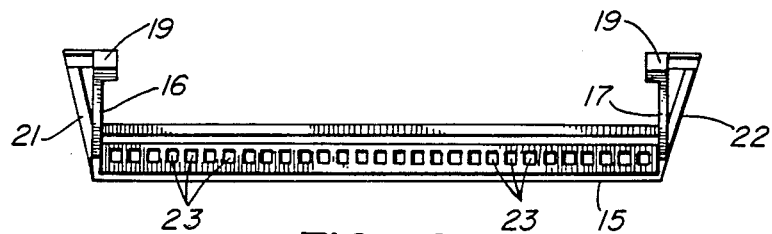
FIG. 2 is a top plan view of one of the support devices of FIG. 1.
Figure 3:
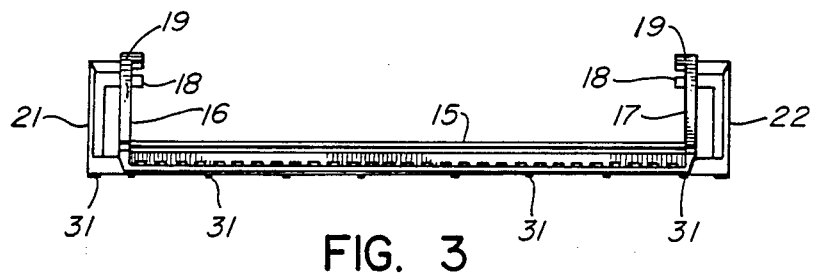
FIG. 3 is a front view of the support device of FIG. 2.
Figure 4:
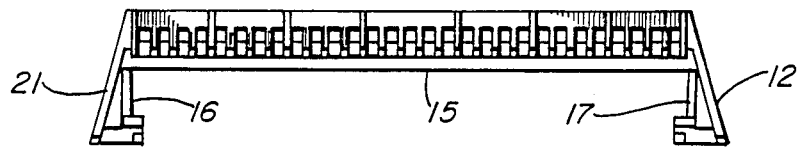
FIG. 4 is a bottom view of the support device of FIG. 2.
Figure 5:
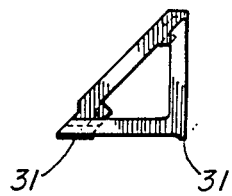
FIG. 5 is an end view of the support device of FIG. 2.

As shown in the drawings, particularly FIGS. 1, 2, and 4, the wing frames 21 and 22 are preferably angled outwardly thereby allowing a plurality of support structures such as 12 and 13 to be nestled in close proximity. Since the wing frames are angled outwardly from the mounting frame, they fit into one another and the hybrid circuits mounted on a plurality of support devices may be mounted adjacent one another at a distance approximately corresponding to the thickness of the mounting frames.

Figure 6:
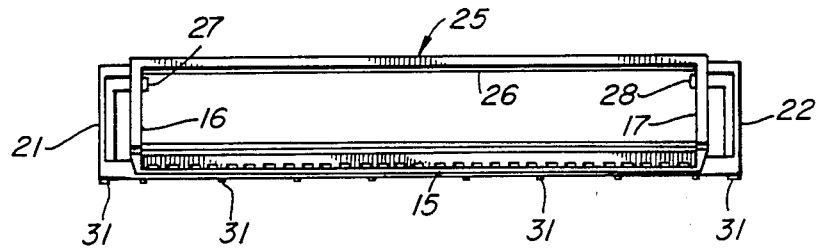
FIG. 6 is a front view of an alternative embodiment of a support device in accordance with the invention.

FIG. 6 illustrates an alternative embodiment of the invention from that shown in FIGS. 1 to 5. The mounting frame for the hybrid circuit (not shown) is shown to be a rectangular frame comprised of a base portion 15, the vertical arms 16 and 17 of wing frames 21 and 22 and horizontal member 26. In this case, the hybrid circuit is mounted in the frame 25 by inserting the connecting pins of the circuit into the holes in the base 15 and pressing the circuit into the frame 25 until it engages the protrusions 27 and 28. The latter may be designed to hold the hybrid circuit by friction. Alternatively, the frame may be designed to have a depth greater than the thickness of the hybrid circuit thereby allowing the protrusions 27 and 28 to lock it into the frame 25.

Figure 7:
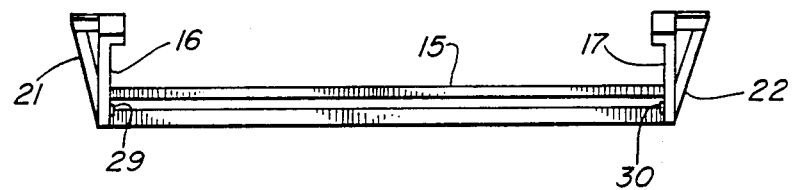
FIG. 7 is a top plan view of yet another embodiment of a support device in accordance with the invention.

FIG. 7 shows a support device similar to that of FIGS. 1 to 5 except that the base portion is shown not to have a plurality of holes for receiving the connecting pins of a hybrid circuit. In this embodiment, the hybrid circuit is supported by the C-shaped frame comprised of the base portion 15 and the arms 16 and 17 of the wing frames 21 and 22. In order to secure the bottom portion of a hybrid circuit within the frame, a pair of tabs 29 and 30 may be provided at the base end of arms 16 and 17.

As shown in FIGS. 3, 4, 5, and 6 the bottom surface of the base portion 15 may be provided with a plurality of projections 31 distributed along its length as well as at the bottom surface of the wing frames 21 and 22. These projections prevent the bottom surface of the support structure to be in full contact with the printed circuit board, thereby allowing cleaning solvents to flow through under the base portion of the support device.

As indicated by the above description, the invention provides a practical, economical and versatile support device for the mounting of daughterboards or hybrid circuit boards on printed circuit boards. It is understood that other embodiments of the invention may be realized without departing from the scope and spirit of the invention.

What is claimed is:

1. A device for mounting a thick film hybrid circuit on a printed circuit board comprising, a frame of plastic material into which the hybrid circuit may be mounted and a pair of wing frames each one secured to a respective edge of the mounting frame and projecting therefrom in the same direction, the wing frames being shaped to prop the mounting frame at a predetermined angle from 0 to 90 degrees in relation to the printed circuit board.

2. A device for mounting a hybrid circuit on a printed circuit board as defined in claim 1 wherein the wing frames are integral with the mounting frame.

3. A device for mounting a hybrid circuit on a printed circuit board as defined in claim 2 wherein the wing frames are triangularly shaped and are angled outwardly away from the mounting frame thereby allowing a plurality of support structures to be nestled adjacent one another in close proximity.

4. A device for mounting a hybrid circuit on a printed circuit board as defined in claim 3 wherein the mounting frame is a C-shaped resilient frame, the extremities of the C-shaped frame each having a pair of cooperating tabs adapted to support a respective corner of the hybrid circuit.

5. A device for mounting a hybrid circuit on a printed circuit board as defined in claim 4 wherein the base of the mounting frame is provided with a plurality of holes located cooperatively with connecting pins of the hybrid circuit.

6. A device for mounting a hybrid circuit on a printed circuit board as defined in claim 5 wherein the surface of the device facing the printed circuit board is provided with a plurality of projections for preventing the surface from coming into full contact with the printed circuit board.

7. A device for mounting a hybrid circuit on a printed circuit board as defined in claim 3 wherein the mounting frame is a rectangular frame adapted to receive the hybrid circuit and means for securing the circuit within the frame.

8. A device for mounting a hybrid circuit on a printed circuit board as defined in claim 7 wherein the base of the mounting frame is provided with a plurality of holes located cooperatively with connecting pins of the hybrid circuit.

9. A device for mounting a hybrid circuit on a printed circuit board as defined in claim 8 wherein the securing means comprises at least a pair of protrusions along the inside periphery of the mounting frame for preventing the hybrid circuit from coming out of the frame.

* * * * *